INVENTOR
John Michael Parkyn
BY
Baldwin & Wight
ATTORNEYS

United States Patent Office 3,413,566

Patented Nov. 26, 1968

3,413,566

WIDE FREQUENCY RANGE SIGNAL GENERATORS INCLUDING A NUMBER OF ALTERNATIVELY UTILIZED OSCILLATORS

John Michael Parkyn, St. Albans, England, assignor to Marconi Instruments Limited, London, England, a British company Filed Jan. 5, 1966, Ser. No. 518,892
Claims priority, application Great Britain, Jan. 7, 1965, 781/65
3 Claims. (Cl. 331—49)

ABSTRACT OF THE DISCLOSURE

A wide frequency range signal generator including a plurality of independent oscillators each adjustable over a different sub-range of the total wide frequency range thereof. The oscillators being arranged to oscillate simultaneously, each having the output circuit thereof shunted by a voltage controllable impedance. Each such voltage controllable impedance having associated therewith a control voltage applying circuit. The output circuits of the individual oscillators are connected in parallel with the output circuit of the signal generator. The control voltages applied to the impedances being normally of a value suitable to cause a low shunt impedance thus preventing oscillations from reaching the output circuit of the signal generator. Signals from any one oscillator are applied to the signal generator output circuit upon application of a control voltage suitable to cause a high shunt impedance across the output of the associated oscillator.

Figure 1:
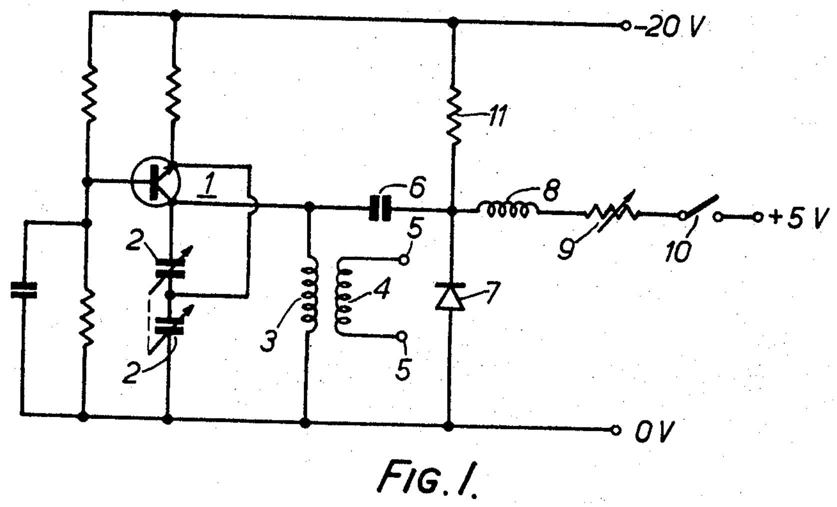

This invention relates to signal generators suitable for use for measurement, testing and similar purposes and more specifically to wide frequency range signal generators of the kind in which a required wide frequency ranch of oscillations is provided by a plurality of separate independent transistor oscillators each of which covers a different sub-range i.e. a different portion of the said wide range. Such signal generators have the important advantage of better frequency accuracy and stability as compared with comparable generators in which a single oscillator transistor is used for the whole range and different reactances, each for a different sub-range, are switched into or out of circuit with said single transistor in order to change over from one sub-range to another. However, it takes substantial time for any transistor oscillator to "settle down" to its intended operating frequency, for the transistor itself and also the reactances in the frequency determining circuit thereof must reach their stable operating temperatures before frequency drifting ceases or at any rate reduces to the low value required from a high quality signal generator for testing, measurement or the like. Known signal generators of the kind referred to, wherein each independent oscillator is simply switched on or off by switching operating potentials therefor on or off to bring it into or out of use have the serious defect that, when any oscillator previously out of use is switched on to provide output within a required frequency sub-range, it is necessary to wait a substantial time, which may be many minutes, before the oscillator "settles down" and provides accurately a required frequency in accordance with its calibrated setting or adjustment. The present invention seeks to overcome this defect. Though not limited to its use for any particular frequency range the invention is particularly suitable for and primarily intended for signal generators in the megacycle range and may be used with advantage for generators covering, for example a range of 10 to 1000 mc./s.

According to this invention a wide frequency range signal generator of the kind referred to comprises a plurality of independent transistor oscillators each covering a different sub-range of the whole range and each of which is provided, in effective parallel with its output circuit, with a voltage controllable impedance which can be changed by an applied control voltage from a value of shunt impedance in which said oscillator is able to provide output oscillations, to a value of shunt impedance in which said oscillator is unable to provide output oscillations and means are provided for changing said applied control voltage to alter said shunt impedance from one value to the other. With this invention the signal generator may be switched on as a whole, when required to be used, allowed to "warm up" as a whole to its stable operating conditon and thereafter used over any sub-range without having to wait a substantial time after changing over from one sub-range to another.

Preferably the voltage controllable impedance is a diode with the control voltage changing the bias voltage applied thereto.

The control voltage may be constituted by voltage drop produced across a resistance by a voltage source connectable thereto through a switch which, when opened, eliminates said voltage drop. The two values of control voltage in this case being 0 volts upon elimination of the aforementioned voltage drop and that voltage value attributable to such voltage drop. The resistance may be manually adjustable or it may be automatically adjusted, when the oscillator is providing output oscillations, in dependence upon the output oscillation amplitude. In this way a good degree of constancy of output oscillation amplitude may be obtained when the oscillator is providing output oscillations. In one arrangement of this kind a resistance, voltage drop across which is employed as the control voltage, may be constituted by a transistor the base voltage of which is derived by rectifying output oscillations from the oscillator.

Figure 2:
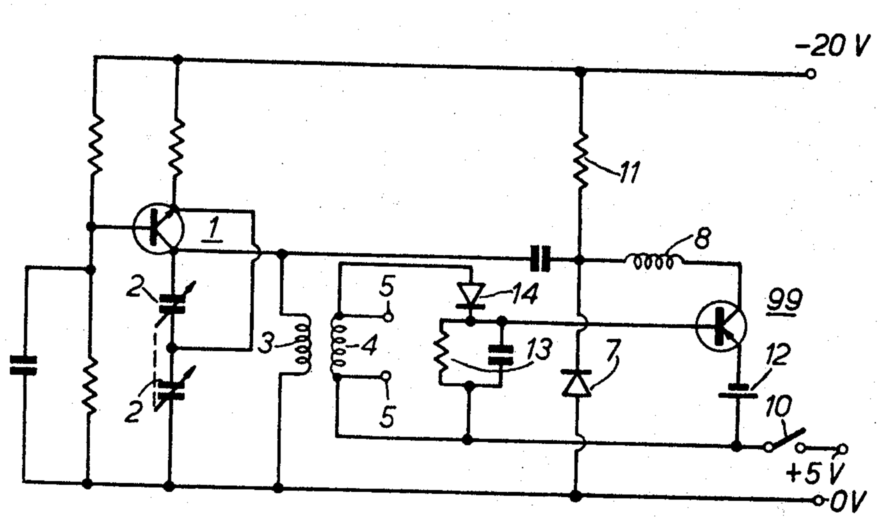

The invention is illustrated in the accompanying diagrammatic drawings in which FIGURE 1 shows an embodiment wherein control voltage is derived from voltage drop across a manually adjustable resistance and FIGURE 2 shows a modification in which the manually adjustable resistance of FIGURE 1 is replaced by a transistor the base voltage of which is derived by rectifying oscillations from the oscillator. Each of FIGURES 1 and 2 shows one oscillator only. It is to be understood that, in a wide frequency range signal generator there would be a plurality of oscillators each as shown in FIGURE 1 or FIGURE 2 (as the case may be) and which are all alike except for the frequency sub-range covered. Thus, for example, there might be four similar oscillators each as shown in FIGURE 1 or FIGURE 2 covering respectively the sub-ranges 10–100 mc./s., 100–250 mc./s., 250–500 mc./s. and 500–1000 mc./s., the switches in the separate oscillators being controlled to be closed one at a time by the sub-range selection handle. Like references denote like parts in the two figures.

Referring to FIGURE 1 the transistor 1 is connected with a frequency determinable or adjustable tunable circuit comprising tuning condenser 2 and transformer primary 3 in the well-known Colpitt's oscillator circuit. The transformer secondary 4 is connected to the output terminals 5. Connected through the condenser 6 across the primary 3 is a diode 7. The "live" side of the diode is connected through a choke 8 a resistance 9, which may conveniently be adjustable, and a switch 10 to a suitable source of back bias for the diode—for example a source of +5 v. When switch 10 is open the diode is biassed through resistance 11 to present a low impedance such that the oscillator is accordingly unable to provide output oscillations at terminal 5. When switch 10 is closed, however, the diode presents a high impedance permitting the provision of output oscillations at the terminals 5. A number of oscillators, for example four, each as shown in FIGURE 1 and each for a different adjacent sub-range, may thus be used to cover a wide overall frequency range and by selectively closing any of the switches 10, which are controlled in practice by a common sub-range selector handle (not shown) any of the oscillators can be brought into effective use to provide oscillations at output terminals 5 common to all the oscillators. A signal generator comprising a plurality of such oscillators is, in use, switched on as a whole when required, is allowed to "settle down" as a whole for the necessary period and thereafter can be switched as required from one sub-range to another without having to wait for a substantial time after each sub-range switching operation.

In the modification shown in FIGURE 2 the resistance 9 of FIGURE 1 is replaced by a transistor 99 which acts as an automatically controlled resistance. Its emitter circuit is completed through a suitable potential source 12 and its base voltage is controlled by voltage set up across a resistance 13 which is in series with a rectifying diode 14 across the secondary 4. Through the base drive circuit, including resistance 13 and diode 14 automatic control of output oscillation amplitude to achieve substantial constancy thereof is obtained when the switch 10 is in use i.e. when output oscillations appear at terminals 5.

I claim:

1. A wide frequency range signal generator comprising a plurality of independent transistor oscillators each adjustable over a different sub-range of the whole range, each of said oscillators having electrically connected thereto, in effective parallel with its output circuit, voltage controllable impedance means responsive to an applied control voltage for providing a value of shunt impedance in which said oscillator is able to provide output oscillations and for providing a value of shunt impedance in which said oscillator is unable to provide output oscillations and means electrically connected to said impedance means for changing said applied control voltage to alter said shunt impedance from said one value to the other, said means for changing said applied control voltage comprising resistance means and switch means, the control voltage being constituted by a voltage drop produced across said resistance means by a voltage source connectible thereto through said switch means which, when opened, eliminates said voltage drop, said resistance means being electrically connected to said oscillator for automatically adjusting the resistance thereof in dependance upon the output oscillation amplitude.

2. A signal generator as claimed in claim 1 further comprising rectifying means for rectifying output oscillations of the oscillator, said resistance, voltage drop across which is employed as the control voltage, comprising a transistor the base voltage of which is provided by the rectified output oscillations.

3. A wide frequency range signal generator capable of generating signals of any frequency within said wide frequency range and comprising a plurality of frequency adjustable oscillators having means for individually adjusting the frequency of oscillation thereof over differing sub-ranges of frequency which, in combination, form said wide frequency range, a plurality of voltage controllable impedance means each electrically connected to one of said oscillators for providing a variable shunt impedance across the output of each oscillator, a plurality of control voltage applying means each electrically connected to an associated one of said voltage controllable voltage impedance means for applying an impedance determining voltage to said associated impedance means, said voltage controllable impedance means being responsive to a predetermined value of impedance determining voltage to prevent oscillatory output from an associated oscillator, each of said plurality of control voltage applying means comprising transistor resistance means, said transistor resistance means having base drive means electrically connected to the output of the associated oscillator and to the base of said transistor resistance means, said transsistor resistance means being effective to control the output amplitude of the associated oscillator and to determine the value of impedance determining voltage applied to said associated impedance means.

References Cited

UNITED STATES PATENTS 2,486,208 10/1949 Rienstra ------------ 84—1.26

JOHN KOMINSKI, *Primary Examiner.*